United States Patent
Tsai

(10) Patent No.: US 7,669,642 B1
(45) Date of Patent: Mar. 2, 2010

(54) THERMAL MODULE

(75) Inventor: Ching Hsien Tsai, Sinjhuang (TW)

(73) Assignee: Aisa Vital Components Co., Ltd., Taipei County (TW)

( * ) Notice: Subject to any disclaimer, the term of this patent is extended or adjusted under 35 U.S.C. 154(b) by 0 days.

(21) Appl. No.: 12/288,624

(22) Filed: Oct. 22, 2008

(30) Foreign Application Priority Data

Sep. 24, 2008 (TW) .............................. 97217253 U

(51) Int. Cl.
*H05K 7/20* (2006.01)
(52) U.S. Cl. ................ 165/80.3; 165/80.4; 165/104.33; 361/699; 361/700
(58) Field of Classification Search ................ 165/80.3, 165/80.4, 104.33, 185; 361/697, 699, 700
See application file for complete search history.

(56) References Cited

U.S. PATENT DOCUMENTS

| 7,165,603 B2 * | 1/2007 | Mochizuki et al. ...... 165/104.21 |
| 7,440,278 B2 * | 10/2008 | Cheng ........................ 361/699 |
| 2004/0240179 A1 * | 12/2004 | Koga et al. ................... 361/699 |
| 2006/0278372 A1 * | 12/2006 | Lai et al. ................ 165/104.33 |
| 2007/0034355 A1 * | 2/2007 | Kuo ........................... 165/80.4 |
| 2007/0163270 A1 | 7/2007 | Chien et al. |
| 2007/0284094 A1 * | 12/2007 | Pawlak et al. ................ 165/122 |
| 2008/0137301 A1 * | 6/2008 | Huang et al. ................. 361/700 |
| 2008/0225486 A1 * | 9/2008 | Cheng ......................... 361/699 |
| 2008/0239672 A1 * | 10/2008 | Ghoshal et al. ............. 361/701 |
| 2008/0264608 A1 * | 10/2008 | Tye et al. ................ 165/104.14 |
| 2008/0310105 A1 * | 12/2008 | Cheng ......................... 361/695 |

FOREIGN PATENT DOCUMENTS

JP    06109382 A  *  4/1994

* cited by examiner

*Primary Examiner*—Allen J Flanigan

(57) ABSTRACT

A thermal module includes at least one heat dissipating element, at least one cooling chip, and a heat radiating unit. The cooling chip has a cold end in contact with one side of the heat dissipating element and a hot end in contact with the heat radiating unit. With the cooling chip in direct contact with the heat radiating unit and the heat dissipating element, the heat dissipating element can be directly cooled by the cooling chip, and the thermal module can have a simplified structure to occupy a reduced room while providing enhanced heat dissipating efficiency and accordingly upgraded heat-dissipating effect.

9 Claims, 5 Drawing Sheets

THERMAL MODULE

FIELD OF THE INVENTION

The present invention relates to a thermal module, and more particularly to a thermal module having a cooling chip in direct contact with a heat-radiating element and a heat dissipating element to enable upgraded heat-dissipating efficiency.

BACKGROUND OF THE INVENTION

When an electronic device operates at a high speed, electronic components inside the electronic device would generate a large amount of heat. In general, a thermal module consisting of a heat sink or a radiating fin assembly and one or more heat pipes is mounted to the heat-generating electronic components to obtain enhanced heat-dissipating efficiency and upgraded heat-dissipating effect. However, since the heat sink or radiating fin assembly of the thermal module can only radiate heat, the thermal module provides a very limited heat-dissipating effect. For the purpose of obtaining an improved heat dissipating effect, a cooling chip has been used with the thermal module.

FIG. 1 shows a conventional water-cooling thermal module, which includes a first heat dissipating unit 11, a second heat dissipating unit 12, a pump 13, a set of water pipes 14, a cooling chip 15, a heat exchanger 16, and a seat 17. The first heat dissipating unit 11 has a receiving space (not shown), a flow way (not shown), a water inlet 111, a water outlet 112, and a first contact face 113. The receiving space of the first heat dissipating unit 11 has a fluid filled therein and is communicable with the seat 17 and the heat exchanger 16 via water pipes 14. The second heat dissipating unit 12 has a receiving space (not shown), a flow way (not shown), a water outlet 121, a water inlet 122, and a second contact face 123. The receiving space of the second heat dissipating unit 12 is communicable with the heat exchanger 16 and the pump 13 via water pipes 14. The cooling chip 15 has a hot face 151 and a cold face 152 bearing on the first contact face 113 and the second contact face 123, respectively. The pump 13 drives the fluid filled in the first heat dissipating unit 11 to flow in the above components of the thermal module. The seat 17 is in contact with a heat source (not shown) for absorbing heat generated by the heat source.

In the above arrangements, the cooling chip 15 is not in direct contact with the heat exchanger 16, and there are many complicated components included in the conventional water-cooling thermal module. The first and second heat dissipating units 11, 12 can only indirectly dissipate the heat produced by the heat source. Therefore, the heat generated by the heat source and absorbed by the seat 17 could not be directly dissipated, and the conventional water-cooling thermal module has poor heat dissipating efficiency and limited heat dissipating effect.

In brief, the conventional water-cooling thermal module has the following disadvantages: (1) having complicated structure; (2) providing poor heat-dissipating effect; (3) failing to directly dissipate the heat generated by the heat source; and (4) having low heat dissipating efficiency.

It is therefore tried by the inventor to develop an improved thermal module to overcome the disadvantages of the conventional thermal module.

SUMMARY OF THE INVENTION

A primary object of the present invention is to provide a thermal module having a simplified structure and including a cooling chip in direct contact with a heat-radiating element and a heat dissipating element.

To achieve the above and other objects, the thermal module according to the present invention includes at least one heat dissipating element, at least one cooling chip, and a heat radiating unit. The cooling chip has a cold end in contact with one side of the heat dissipating element and a hot end in contact with the heat radiating unit. With the cooling chip in direct contact with the heat radiating unit and the heat dissipating element, the heat dissipating element can be directly cooled by the cooling chip, and the thermal module can have a simplified structure to occupy a reduced room while providing enhanced heat dissipating efficiency and accordingly upgraded heat-dissipating effect.

With the above arrangements, the thermal module of the present invention has the following advantages: (1) having a simplified structure; (2) requiring lowered manufacturing cost; (3) providing improved heat dissipating effect; (4) occupying only a reduced room; and (5) being easy to assemble.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
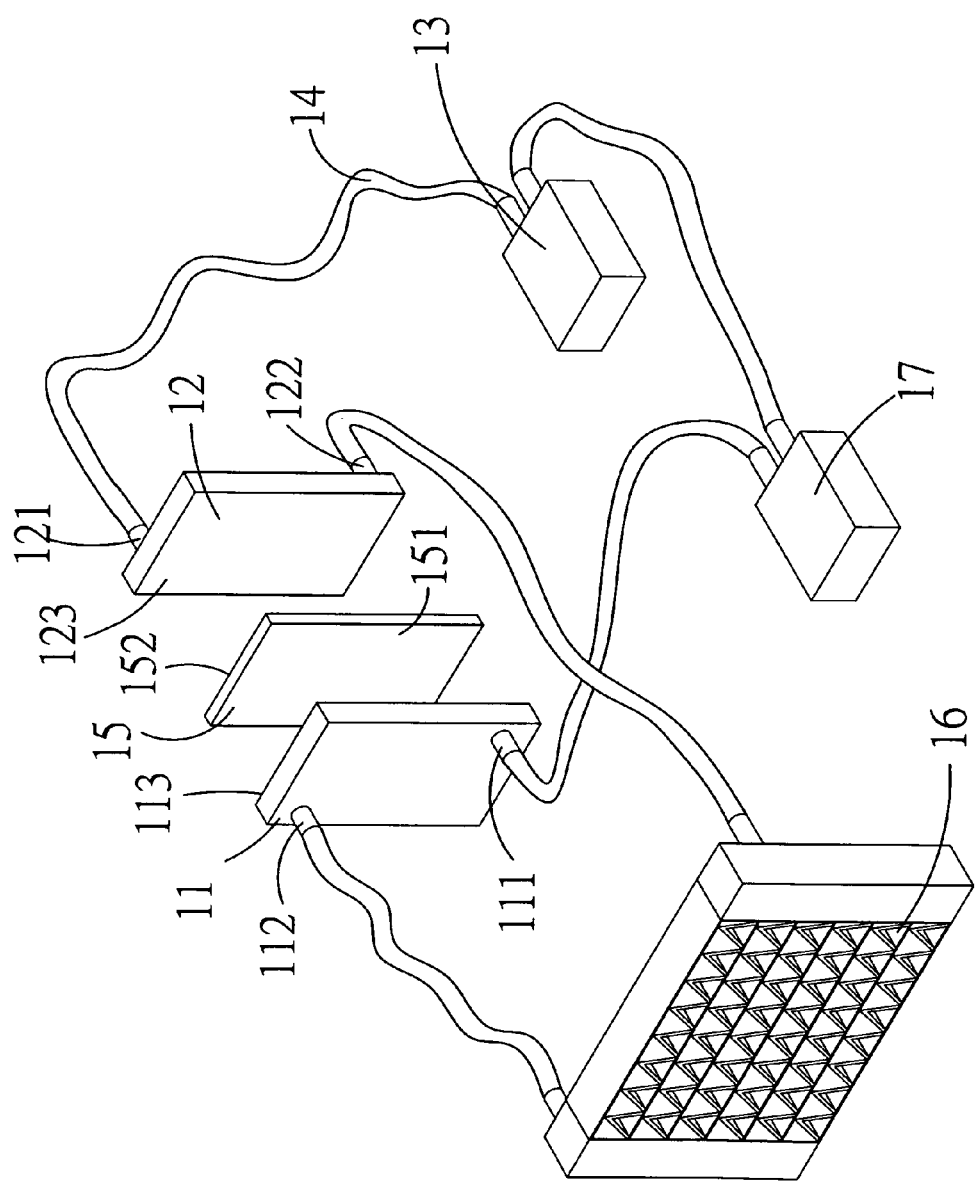
FIG. 1 is an assembled perspective view of a conventional thermal module.
Figure 2:
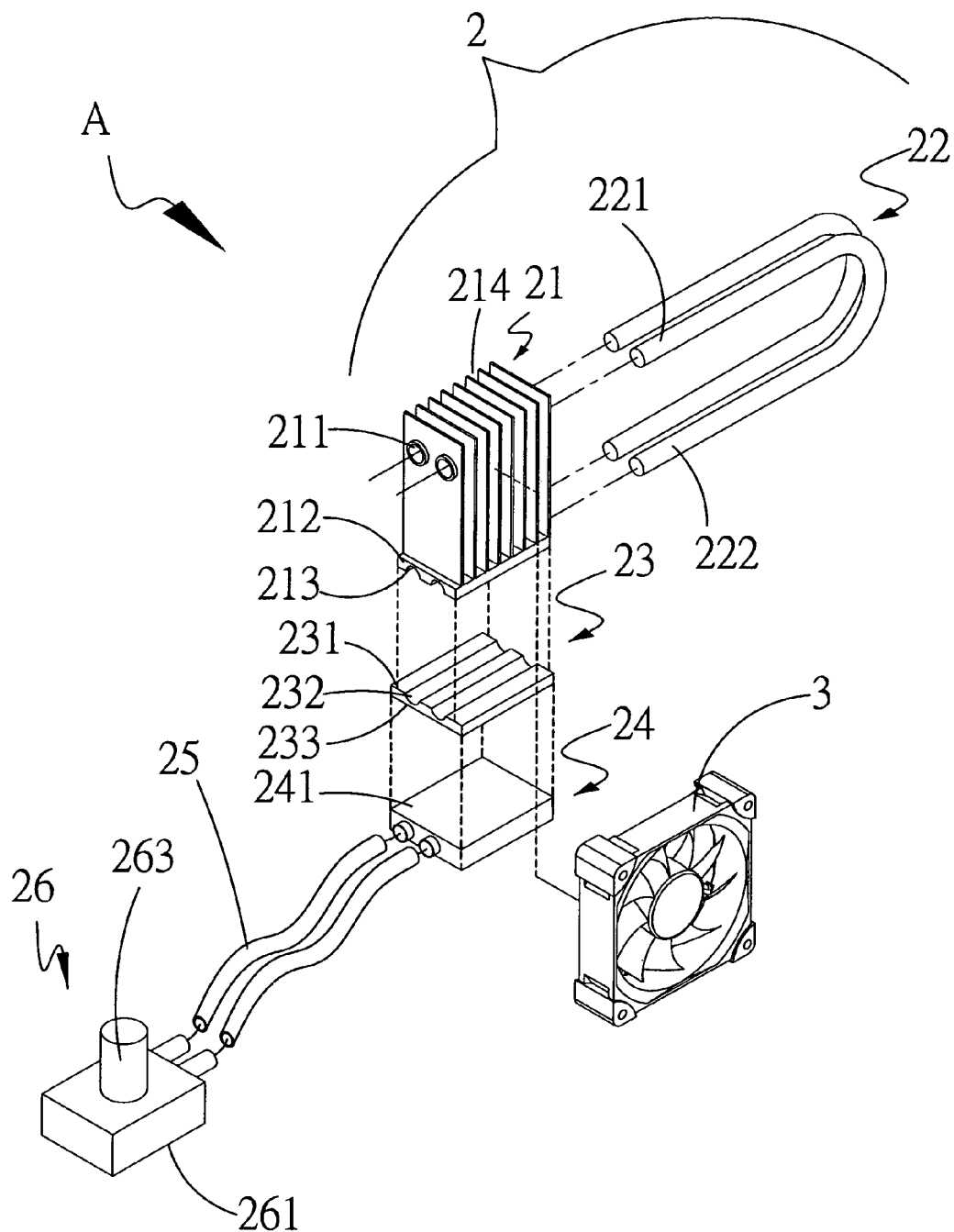
FIG. 2 is an exploded perspective view of a thermal module according to a preferred embodiment of the present invention.
Figure 3:
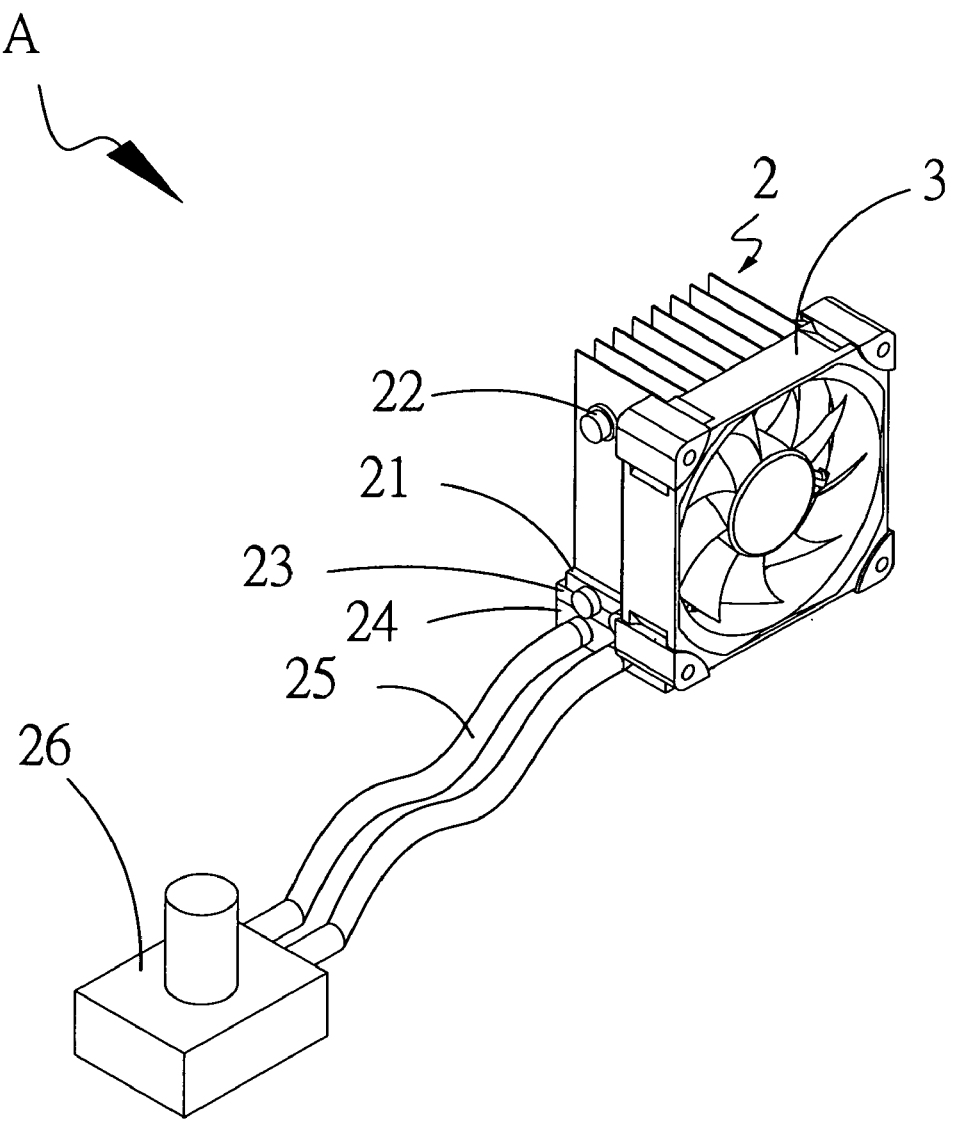
FIG. 3 is an assembled view of FIG. 2.

Please refer to FIGS. 2 and 3 that are exploded and assembled perspective views, respectively, of a thermal module according to a preferred embodiment of the present invention. As shown, the thermal module of the present invention is generally denoted by a reference numeral A, and includes at least one heat dissipating element 24, at least one cooling chip 23, and a heat radiating unit 2.

Figure 4:
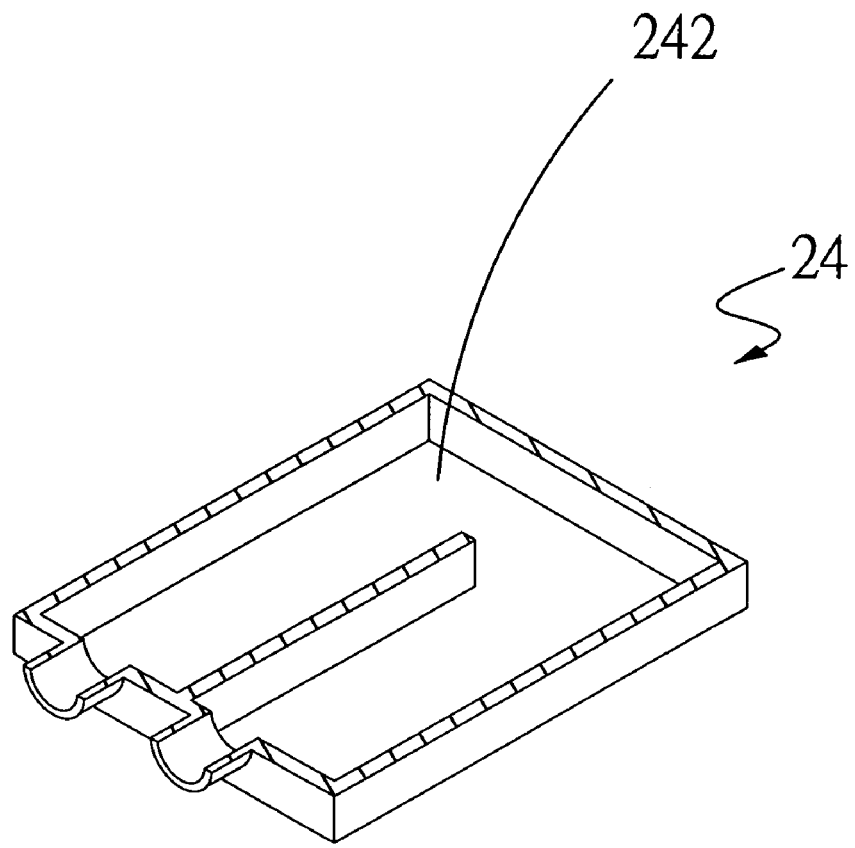
FIG. 4 is a cutaway view of a heat dissipating element adopted in the present invention.

The heat dissipating element 24 has a heat-radiating face 241 formed on one side thereof, and internally defines a heat-dissipation space 242, as can be seen from FIG. 4. And, the heat-dissipation space 242 formed inside the heat dissipating element 24 is in contact with the heat-radiating face 241.

The cooling chip 23 has a hot end 231 and a cold end 233. The cold end 233 is in contact with the heat-radiating face 241 of the heat dissipating element 24, and the hot end 231 is in contact with the heat radiating unit 2. Accordingly, the cooling chip 23 is in direct contact with the heat radiating unit 2 and the heat dissipating element 24 to cool the heat dissipating element 24 directly. With the above arrangements, the thermal module A has a simplified structure to occupy only a very small room while providing a largely upgraded heat-dissipation effect.

The heat radiating unit 2 includes a heat-radiating element 21 and at least one heat pipe 22. The heat-radiating element 21 can be a heat sink or a radiation-fin assembly. In the illustrated preferred embodiment, the heat-radiating element 21 is a heat sink. The heat-radiating element 21 is formed with at least one through hole 211 for a heat-dissipating end 221 of the heat pipe 22 to extend therethrough. The heat-radiating element 21 has a contact section 212 provided with at least one recess 213. The hot end 231 of the cooling chip 23 is provided with at least one groove 232 corresponding to the recess 213. The recess 213 and the groove 232 together form a passage for fixedly holding a heat-conducting end 222 of the heat pipe 22 therein. Heat conducted to the hot end 231 of the cooling chip 23 is transferred to the heat-conducting end 222 of the heat pipe 22 and the heat-radiating element 21, and then conducted to the heat-dissipating end 221 of the heat pipe 22 and a plurality of heat radiating fins 214 of the heat-radiating element 21 to be finally dissipated into ambient air.

The heat-radiating face 241 provided at one side of the heat dissipating element 24 is in contact with the cold end 233 of the cooling chip 23, and the heat-dissipation space 242 formed inside the heat dissipating element 24 is in contact with the heat-radiating face 241.

Figure 5:
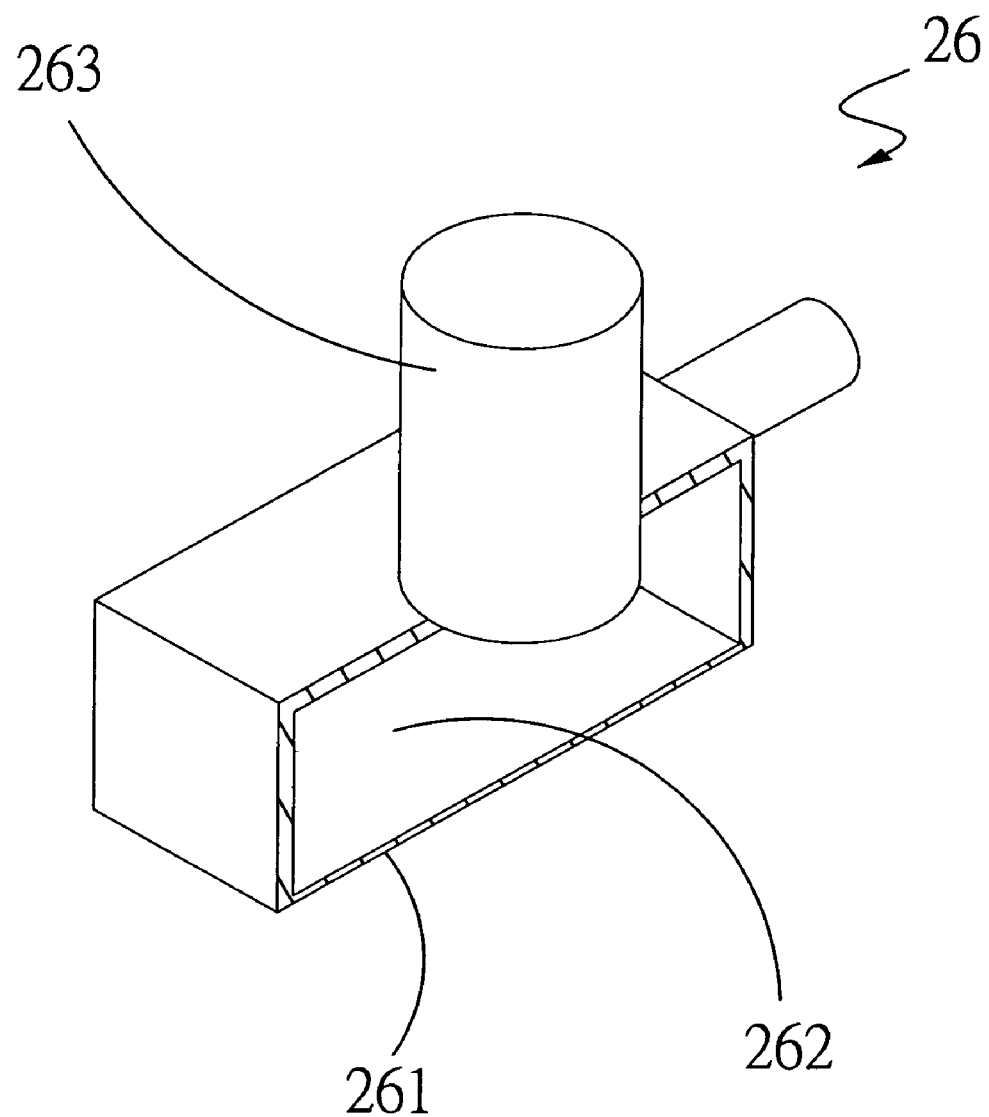
FIG. 5 is a cutaway view of a seat adopted in the present invention.

The thermal module A further includes at least one pipe element 25 and a seat 26. The pipe element 25 communicates the heat dissipating element 24 with the seat 26. As can be seen from FIG. 5, the seat 26 includes at least one heat-conducting face 261, a flow way 262, and a fluid-guiding fan 263. The heat-conducting face 261 is formed on one side of the seat 26. The flow way 262 is formed inside the seat 26 and in contact with the heat-conducting face 261. The fluid-guiding fan 263 is communicable with the flow way 262 for driving a heat-dissipating fluid (not shown) to flow. The pipe element 25 communicates the heat dissipating element 24 with the seat 26, so that the heat-dissipating fluid can circulate in the seat 26 and the heat dissipating element 24.

The cooling chip 23 is located between the heat dissipating element 24 and the heat radiating unit 2 with the cold end 233 of the cooling chip 23 bearing on the heat dissipating element 24 and the hot end 231 in contact with the heat radiating unit 2. The cooling chip 23 functions to cool down the heat dissipating element 24, and accordingly the heat-dissipating fluid circulating in the heat dissipating element 24. The cooled heat-dissipating fluid can flow back to the seat 26 to carry away heat absorbed by the seat 26. With the heat-dissipating fluid constantly circulating in the seat 26 and the heat dissipating element 24, the thermal module A can have a largely enhanced heat dissipating efficiency.

In addition, a cooling fan 3 can be mounted to one side of the heat radiating unit 2 of the thermal module A to further enhance the heat-dissipating efficiency of the thermal module A.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A thermal module, comprising at least one heat dissipating element, at least one cooling chip, and a heat radiating unit; the heat radiating unit including a heat-radiating element and at least one heat pipe; the cooling chip having a cold end contacting with one side of the heat dissipating element and a hot end contacting with the heat radiating unit; the heat-radiating element being formed with at least one through hole and at least one recess; the heat pipe having a heat-dissipating end extended through the through hole on the heat-radiating element, and a heat-conducting end held between the recess of the heat radiating element and the hot end of the cooling chip; and wherein the heat dissipating element has a heat-radiating face formed on the side of the heat dissipating element in contact with the cold end of the cooling chip, and a heat-dissipation space formed inside the heat dissipating element to contact with the heat radiating face.

2. The thermal module as claimed in claim 1, wherein the heat-radiating element is a heat sink having a plurality of radiating fins.

3. The thermal module as claimed in claim 1, wherein the heat-radiating element is a radiating-fin assembly.

4. The thermal module as claimed in claim 1, further comprising a cooling fan mounted to one side of the heat-radiating element.

5. A thermal module comprising at least one heat dissipating element, at least one cooling chip, and a heat radiating unit; the heat radiating unit including a heat-radiating element and at least one heat pipe; the cooling chip having a cold end contacting with one side of the heat dissipating element and a hot end contacting with the heat radiating unit; the heat-radiating element being formed with at least one through hole and at least one recess; the heat pipe having a heat-dissipating end extended through the through hole on the heat-radiating element, and a heat-conducting end held between the recess of the heat radiating element and the hot end of the cooling chip; a seat including a heat-conducting face formed on one side of the seat, a flow away formed inside the seat to contact with the heat-conducting face, and a fluid-guiding fan communicable with the flow way; and at least one pipe element communicating the seat with the heat dissipating element.

6. The thermal module as claimed in claim 5, wherein the heat-radiating element is a heat sink having a plurality of radiating fins.

7. The thermal module as claimed in claim 5, wherein the heat-radiating element is a radiating-fin assembly.

8. The thermal module as claimed in claim 5, further comprising a cooling fan mounted to one side of the heat-radiating element.

9. The thermal module as claimed in claim 5, wherein the heat dissipating element has a heat-radiating face formed on the side of the heat dissipating element in contact with the cold end of the cooling chip, and a heat dissipation space formed inside the heat dissipating element to contact with the heat-radiating face.

* * * * *